United States Patent [19]

Legrand et al.

[11] 4,263,607
[45] Apr. 21, 1981

[54] SNAP FIT SUPPORT HOUSING FOR A SEMICONDUCTOR POWER WAFER

[75] Inventors: Bernard Legrand, Villiers St Frederic; Michel Masselin, Velizy Villacoublay, both of France

[73] Assignee: Alsthom-Atlantique, Paris, France

[21] Appl. No.: 18,199

[22] Filed: Mar. 6, 1979

[51] Int. Cl.³ .................. H01L 23/42; H01L 23/44; H01L 23/46

[52] U.S. Cl. .................. 357/79; 357/81; 357/68

[58] Field of Search .................. 357/72, 79, 81, 82, 357/68

[56] References Cited

U.S. PATENT DOCUMENTS

| | | | |
|---|---|---|---|
| 2,933,663 | 4/1960 | Connell | 357/79 |
| 3,293,508 | 12/1966 | Boyer | 357/81 |
| 3,727,114 | 4/1973 | Oshima | 357/79 |
| 3,743,893 | 7/1973 | Yamomoto | 357/79 |
| 3,808,471 | 4/1974 | Grandia | 357/79 |
| 3,972,063 | 7/1976 | Kimura et al. | 357/82 |
| 3,992,717 | 11/1976 | Rice | 357/72 |
| 4,041,523 | 8/1977 | Vogt | 357/81 |

FOREIGN PATENT DOCUMENTS 7734472 of 1979 France .................. 357/79

OTHER PUBLICATIONS

IBM Technical Disclosure Bulletin; Grooved Multi-wafer Liquid Cooled Package; Aimi; vol. 17, No. 3, Aug. 1974 p. 655.

*Primary Examiner*—Andrew J. James
*Attorney, Agent, or Firm*—Sughrue, Rothwell, Mion, Zinn and Macpeak

[57] ABSTRACT

A support housing for a semiconductor wafer which is centered therein between the anode block and the cathode block. It includes two polygonal insulating plates which bear against each of the blocks fitted with notches at 120° to one another in which insulating pins are snap-fitted. In the case of a thyristor, a flexible wire is connected to a contact piece with a spherical end in contact with the trigger of the thyristor by means of a spiral spring. Application to the railway field.

2 Claims, 2 Drawing Figures

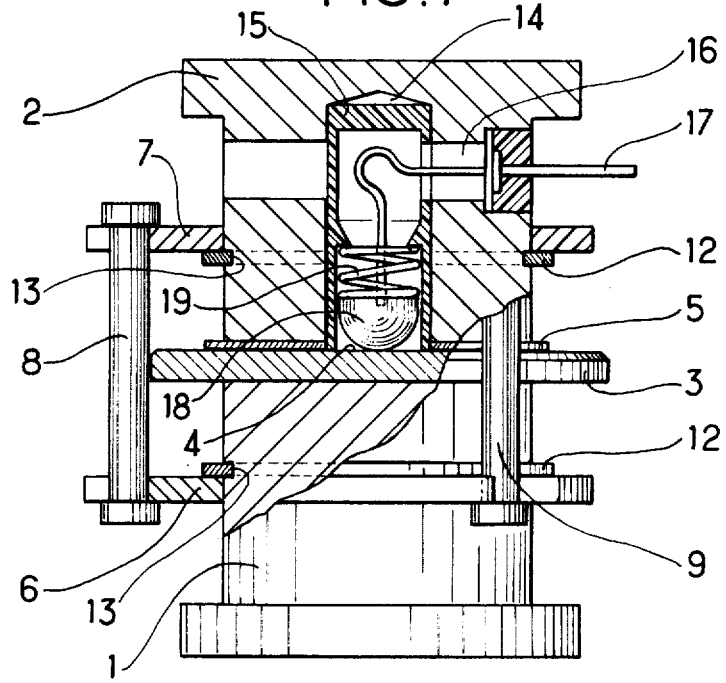
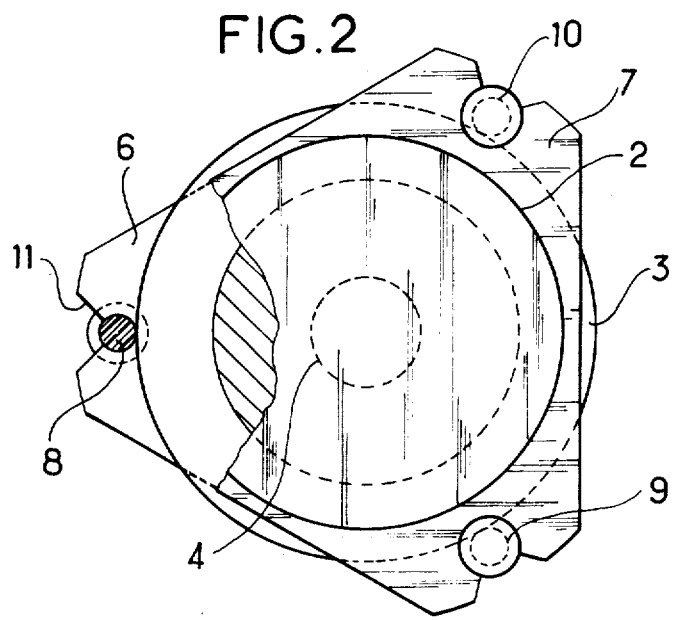

SNAP FIT SUPPORT HOUSING FOR A SEMICONDUCTOR POWER WAFER

FIELD OF THE INVENTION

The present invention relates to a support housing of a semiconductor power wafer, preferably for immersion in a fluorinated hydrocarbon for cooling purposes.

BACKGROUND OF THE INVENTION

It is known that power diodes or thristors cooled in a chamber which contains a fluorinated hydrocarbon in the liquid state are constituted by a semiconductor wafer sandwiched between two deformable metal membranes which hold and centre the wafer in the ceramic housing which is itself pressed between two metal blocks generally made of copper and which form current inlets for the anode and the cathode.

Omitting the ceramic housing and the deformable membranes, which hinder the dissipation of heat improves the cooling of the wafer, but the blocks and the semiconductor wafer are no longer held mechanically. Therefore, the wafer is no longer mechanically centred with respect to the metal blocks and further, in the case of dismatling, the fragile semiconductor wafer has to be handled.

Supplying the triggers of conventional thyristors is also a problem. Conventional thyristors are disposed at the centre of the wafer and have been controlled, up till now, by leaf springs held inside an axial recess of the cathode block.

The leaf springs had two functions: conveying the trigger control current and pressing the trigger component of the wafer. The disadvantages of such a system are that the end of the spring scrapes the semiconductor material and may damage it subsequent to mechanical vibration, and that the pressure exerted by a leaf spring is not precise.

Preferred embodiments of the present invention mitigate these various drawbacks and generally have the following advantages: firstly, mechanical resistance is provided for the wafer between the copper blocks of the anode and of the cathode, with adequate centring of the wafer, easy handling ans storage and rapid installation in an immersed assembly; and secondly, in the case of thyristors, it improves the precision of the mechanical pressure exerted on the trigger and avoids rapid wear of the latter.

SUMMARY OF THE INVENTION

The present invention provides a support housing for a semiconductor power wafer for immersion in a fluorinated hydrocarbon, said support including said semiconductor wafer between two cylindrical metal blocks which act as a cathode and an anode, said semiconductor wafer having a diameter greater than the diameter of the cylinders of said blocks and including on the cathode side, a metal washer with a diameter substantially equal to that of said cylinders, wherein two insulating plates which have substantially polygonal outlines enclose respectively the cathode block and the anode block, each block being provided with a transversal groove and with a circlips, disposed inside said plates and in contact therewith, said plates being made integral with each other by three insulating pins which are tangential to said wafer and can be snap-fitted into three notches disposed at 120° to one another on said polygonal outline.

According to one preferred embodiment, a support housing for a semiconductor power wafer for immersion in a fluorinated hydrocarbon, said support housing including between two cylindrical metal blocks which act as a cathode and an anode, said semiconductor wafer having a diameter greater than the diameters of the cylinders of said blocks, said wafer including, at its centre, a trigger component which controls the triggering of said wafer and also including, on the cathode side, a metal washer with a circular hole whose inner diameter is equal to that of said trigger component and whose outer diameter is substantially equal to that of said cylinders, said cathode block including, along its longitudinal axis, a longitudinal cylindrical bore which contains a sleeve made of insulating material, said cylindrical bore communicating with a transversal bore which is perpendicular to said longitudinal cylindrical bore, is characterized in that there are disposed inside said longitudinal bore a spherical contact piece, a spiral spring which presses said contact piece against said trigger component and a flexible conductor wire insulated from said cathode block and soldered to said contact piece.

An example of the present invention given by way of example is described with reference to the accompanying diagrammatic FIGS. 1 and 2 in which the same components illustrated in both figures bear the same reference symbols therein.

BRIEF DESCRIPTION OF THE DRAWINGS

FIG. 1 is a partially cutaway longitudinal schematic view of a support housing and FIG 2 is a partially cutaway transversal schematic view of the same housing.

DESCRIPTION OF THE PREFERRED EMBODIMENT

As illustrated in FIG. 1, a support housing includes two cylindrical metal blocks 1 and 2 which are good conductors of heat and electricity and are made of copper, for example, and which constitute respectively, an anode terminal and a cathode terminal. A semiconductor wafer 3 whose diameter is larger than that of the blocks 1 and 2 includes a trigger component 4 of a thyristor at its centre. (Other devices, e.g. diodes, can also be mounted in such a support housing). A metal washer 5 whose diameter is substantially equal to that of the blocks 1 and 2 has a hole in its centre to allow access to the trigger component 4 and is designed to make thermal dilation compatible between the wafer 3 and the cathode copper block 2.

The cathode block 1 and the anode block 2 are placed on either side of the wafer 3 and the washer 5 by means of a support constituted by two insulating plates 6 and 7 and three pins 8,9, 10 which end in lugs made of the same insulating material. The insulating plates 6 and 7 can advantageously have a hexagonal form and are provided with notches such as 11 disposed at 120° to one another. The pins 8,9, 10 are snap-fitted into the notches and are tangential to the outer circumference of the wafer 3. The insulating plates 6 and 7 are held in position on the blocks 1 and 2 by circlips 12 engaged in grooves such as 13 milled in the blocks 1 and 2. The wafer 3 is therefore centred in relation to the blocks 1 and 2. The cathode block 2 has a central recess 14 which occupies its longitudinal axis. An insulating sleeve 15 made of teflon or a like material passes therethrough. The length of the sleeve is greater than that of the cathode blocks 2 by an amount equal to the thickness of the washer 5 so as to centre it. The support housing includes mechanical means for making the blocks 1 and 2 integral with one another and can be used equally well for diodes as for power thyristors, either type of device being cooled, in operation, by being immersed in a fluorinated hydrocarbon in the liquid phase.

In the case of thyristors, the invention also relates to the auxiliary triggering system of the trigger. A transversal recess 16 perpendicular to the central recess 14 of the cathode block allows a flexible insulated wire to be installed in the cathode block 2, said wire being used to control the trigger. The wire 17 is soldered to a contact piece 18 whose end in contact with the trigger 4 is spherical. A spiral spring 19 bears against the contact piece 18 so as to provide even pressure on the trigger 4.

Such devices are applicable to railways.

We claim:

1. A snap fit support housing for a semiconductor power wafer capable of immersion in a fluorinated hydrocarbon, said support including two cylindrical metal blocks which act as a cathode and an anode, respectively, said semiconductor wafer having a diameter greater than the diameter of the cylinders of said blocks, being integral therebetween, and including, on the cathode side, a metal washer with a diameter substantially equal to that of said cylinders, the improvement wherein two insulating plates which have substantially polygonal outlines enclose respectively the cathode block and the anode block, each block being provided with a transversal groove and with circlips, disposed inside said plates and in contact therewith, said plates being locked to each other by three insulating pins which are tangential to said wafer and are snap-fitted into three notches disposed at 120° to one another on said polygonal outline.

2. A snap fit support housing according to claim 1, wherein the cathode block including at its center a longitudinal cylindrical bore, an insulating sleeve within said bore having an end which extends beyond the cathode block, said insulating sleeve centering said metal washer on the semiconductor wafer, said washer having a circular hole with a diameter equal to that of the insulating sleeve and having in its center the trigger component which controls the triggering of said wafer, said cylindrical bore communicating with a transversal bore perpendicular to said longitudinal cylindricl bore and wherein there are disposed inside said longitudinal bore a contact piece with a spherical end, a spiral spring pressing said contact piece onto said trigger component and a flexible conductor wire insulated from said cathode block and soldered onto said contact piece.

* * * * *